United States Patent
Kim

(10) Patent No.: US 10,991,419 B2
(45) Date of Patent: Apr. 27, 2021

(54) SEMICONDUCTOR DEVICES AND METHODS OF HANDLING DATA LIFETIME CODES USED THEREIN

(71) Applicant: SK hynix Inc., Icheon-si (KR)

(72) Inventor: Jin Wook Kim, Yongin-si (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/828,395

(22) Filed: Mar. 24, 2020

(65) Prior Publication Data

US 2020/0227112 A1 Jul. 16, 2020

Related U.S. Application Data

(62) Division of application No. 15/818,022, filed on Nov. 20, 2017, now Pat. No. 10,636,478.

(30) Foreign Application Priority Data

Jun. 1, 2017 (KR) .......................... 10-2017-0068502

(51) Int. Cl.
| G11C 7/00 | (2006.01) |
| G11C 11/4093 | (2006.01) |
| G11C 11/408 | (2006.01) |
| G11C 11/406 | (2006.01) |
| G11C 11/4076 | (2006.01) |

(52) U.S. Cl.
CPC ........ *G11C 11/4093* (2013.01); *G11C 11/406* (2013.01); *G11C 11/4076* (2013.01); *G11C 11/4085* (2013.01); *G11C 11/40615* (2013.01)

(58) Field of Classification Search
CPC ..................................................... G11C 7/062
USPC ..................................................... 365/189.07
See application file for complete search history.

(56) References Cited

U.S. PATENT DOCUMENTS

| 7,280,404 | B2 | 10/2007 | Suzuki | |
| 2006/0256769 | A1* | 11/2006 | Cho | H04W 40/24 |
| | | | | 370/351 |
| 2013/0336048 | A1* | 12/2013 | Hokenmaier | G11C 13/0004 |
| | | | | 365/163 |
| 2015/0302925 | A1 | 10/2015 | Oh et al. | |
| 2016/0291872 | A1 | 10/2016 | Hashimoto et al. | |

FOREIGN PATENT DOCUMENTS

KR 100806341 B1 3/2008

* cited by examiner

*Primary Examiner* — Hoai V Ho
(74) *Attorney, Agent, or Firm* — William Park & Associates Ltd.

(57) ABSTRACT

A semiconductor device includes a latch circuit and a code comparison circuit. The latch circuit latches an output code generated based on an active command. The latch circuit outputs the latched output code as a latch code in response to a write command. The code comparison circuit compares the latch code with a write code to generate a detection signal.

10 Claims, 14 Drawing Sheets

| BADD | BANK ADDRESS | RADD | ROW ADDRESS | DATA LIFE CODE | DATA |
|---|---|---|---|---|---|
| L | B1 | L | R1 | 010 | D1 |
| | | H | R2 | 011 | D2 |
| H | B2 | L | R1 | 011→110 | D3 |
| | | H | R2 | 010 | D4 |

FIG. 5

| ADD<2> | ADD<1> | ROW ADDRESS | DATA LIFE CODE | DATA |
|---|---|---|---|---|
| L | L | R1 | 010 | D1 |
| L | H | R2 | 000 | D2 |
| H | L | R3 | 011 | D3 |
| H | H | R4 | 100→011 | D4 |

FIG. 11

SEMICONDUCTOR DEVICES AND METHODS OF HANDLING DATA LIFETIME CODES USED THEREIN

CROSS-REFERENCE TO RELATED APPLICATIONS

The present application is a divisional application of U.S. patent application Ser. No. 15/818,022, filed on Nov. 20, 2017, and claims priority under 35 U.S.C. 119(a) to Korean Application No. 10-2017-0068502, filed on Jun. 1, 2017, which is incorporated herein by reference in its entirety.

BACKGROUND

1. Technical Field

Embodiments of the present disclosure relate to semiconductor devices and methods of handling data lifetime codes used therein.

2. Related Art

Each semiconductor device such as dynamic random access memory (DRAM) devices may include a plurality of memory cells for storing data. Each of the DRAM cells may be configured to include a cell capacitor and a cell transistor. The DRAM devices may store data therein by discharging or charging the cell capacitors. Once the cell capacitor is charged or discharged to store datum therein, an amount of electric charges stored in the cell capacitor has to be ideally constant even though a time elapses. However, the amount of electric charges stored in the cell capacitor may actually vary because of a voltage difference between the cell capacitor and a circuit adjacent to the cell capacitor or because of a leakage current of the cell capacitor. In particular, if the amount of electric charges stored in the cell capacitor is reduced, the cell capacitor may lose datum stored therein to cause a malfunction of the DRAM device. Thus, DRAM devices may require a refresh operation to prevent memory cells from losing data.

SUMMARY

Various embodiments are directed to semiconductor devices and methods of handling data lifetime codes used therein.

According to an embodiment, a semiconductor device includes a latch circuit and a code comparison circuit. The latch circuit latches an output code generated based on an active command. The latch circuit outputs the latched output code as a latch code in response to a write command. The code comparison circuit compares the latch code with a write code to generate a detection signal.

According to another embodiment, a semiconductor device includes a code comparison circuit and a code adjuster. The code comparison circuit compares an output code generated based on a command with a set code to generate a detection signal controlling a predetermined operation. The code adjuster adjusts the output code in response to the detection signal to generate an adjustment code.

According to another embodiment, there is provided a method of handling data lifetime codes of a semiconductor device. The method includes latching an output code generated based on an active command, transforming the latched output code into a latch code based on a write command, and comparing the latch code with a write code to generate a detection signal.

According to another embodiment, there is provided a method of handling a data lifetime code of a semiconductor device. The method includes a step of comparing an output code generated based on a command with a set code to generate a detection signal that controls a predetermined operation and a step of adjusting the output code in response to the detection signal to generate an adjustment code.

BRIEF DESCRIPTION OF THE DRAWINGS

Various embodiments of the present disclosure will become more apparent in view of the attached drawings and accompanying detailed description, in which:

FIG. 5 is a table illustrating an operation of the semiconductor device of FIG. 1;

FIG. 11 is a table illustrating a refresh operation performed in the semiconductor device of FIG. 6;

DETAILED DESCRIPTION OF THE EMBODIMENTS

Various embodiments of the present disclosure will be described hereinafter with reference to the accompanying drawings. However, the embodiments described herein are for illustrative purposes only and are not intended to limit the scope of the present disclosure.

Figure 1:
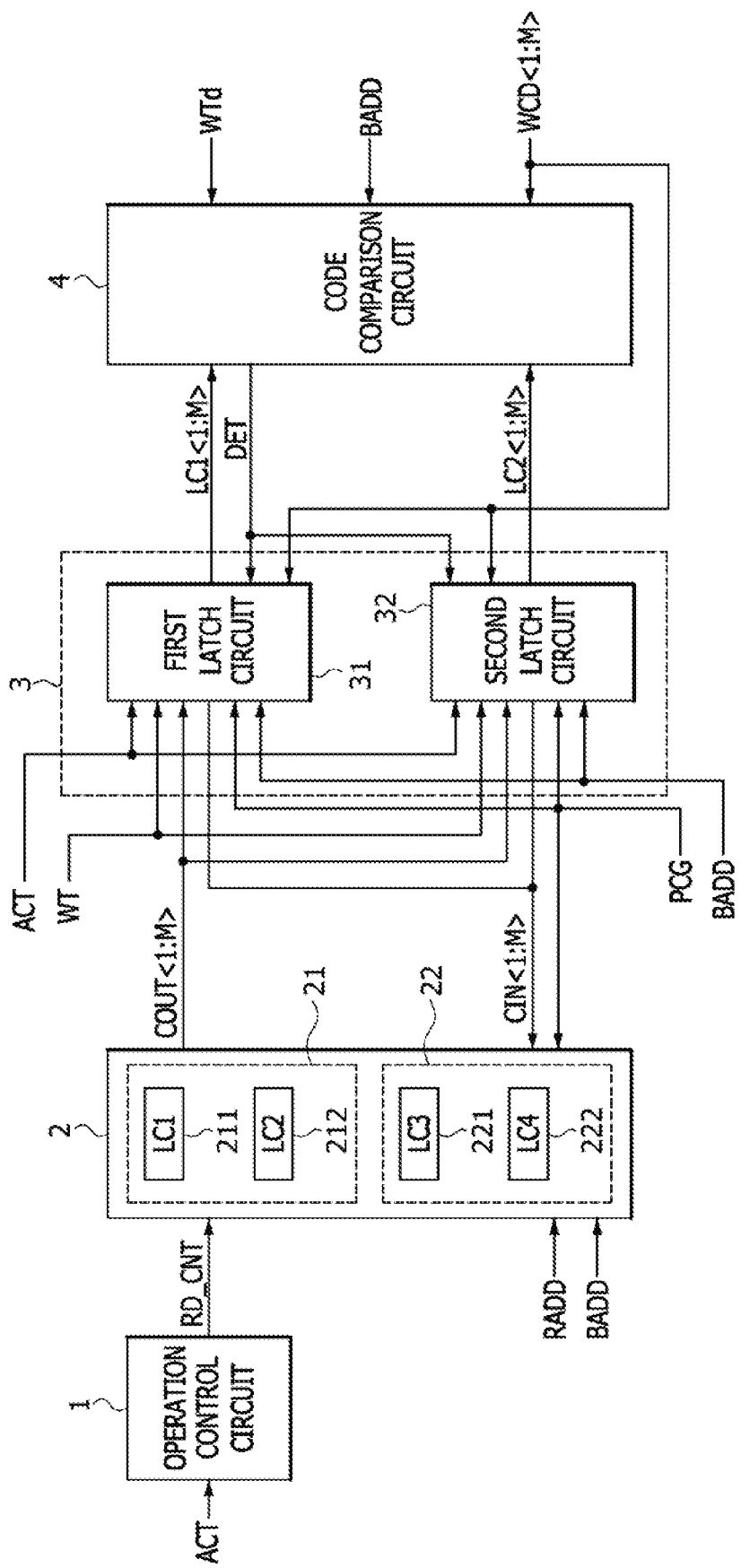
FIG. 1 is a block diagram illustrating a configuration of a semiconductor device according to an embodiment of the present disclosure.

As illustrated in FIG. 1, a semiconductor device according to an embodiment may include an operation control circuit 1, a code storage circuit 2, a latch circuit 3, and a code comparison circuit 4.

The operation control circuit 1 may generate an operation control signal RD_CNT in response to an active command ACT. The operation control circuit 1 may generate the operation control signal RD_CNT which is enabled if the active command ACT is enabled. The active command ACT may be generated by decoding an external command (not shown) and may be enabled to perform an active operation. The active command ACT may be enabled by any one of various manners according to the embodiment. For example, the active command ACT may be enabled by generating a pulse for performing the active operation. The operation control signal RD_CNT may be enabled to control an internal read operation that outputs a data lifetime code which is latched, in other words stored, in the code storage circuit 2. Logic levels of the active command ACT and the operation control signal RD_CNT which are enabled may be set to be different according to the embodiment.

The code storage circuit 2 may include a first bank code storage circuit 21 and a second bank code storage circuit 22. The first bank code storage circuit 21 or the second bank code storage circuit 22 may be selected according to a bank address BADD. For example, the first bank code storage circuit 21 may be selected if the bank address BADD has a logic "low" level, and the second bank code storage circuit 22 may be selected if the bank address BADD has a logic "high" level. The first bank code storage circuit 21 may include a first code storage circuit 211 and a second code storage circuit 212. The first code storage circuit 211 may store a first data lifetime code LC1 corresponding to first data (D1 of FIG. 5). The second code storage circuit 212 may store a second data lifetime code LC2 corresponding to second data (D2 of FIG. 5). The first code storage circuit 211 or the second code storage circuit 212 may be selected by a row address RADD. For example, the first code storage circuit 211 may be selected if the row address RADD has a logic "low" level, and the second code storage circuit 212 may be selected if the row address RADD has a logic "high" level. The second bank code storage circuit 22 may include a third code storage circuit 221 and a fourth code storage circuit 222. The third code storage circuit 221 may store a third data lifetime code LC3 corresponding to third data (D3 of FIG. 5). The fourth code storage circuit 222 may store a fourth data lifetime code LC4 corresponding to fourth data (D4 of FIG. 5). The third code storage circuit 221 or the fourth code storage circuit 222 may be selected by the row address RADD. For example, the third code storage circuit 221 may be selected if the row address RADD has a logic "low" level, and the fourth code storage circuit 222 may be selected if the row address RADD has a logic "high" level. The first, second, third, and fourth code storage circuits 211, 212, 221, and 222 may be realized using dynamic random access memory (DRAM) devices or static random access memory (SRAM) devices.

The code storage circuit 2 may output one of the first to fourth data lifetime codes LC1, LC2, LC3, and LC4 stored in the first to fourth code storage circuits 211, 212, 221, and 222 as an output code COUT<1:M>, in response to the operation control signal RD_CNT. The code storage circuit 2 may output one of the first to fourth data lifetime codes LC1, LC2, LC3, and LC4 as the output code COUT<1:M> according to logic levels of the bank address BADD and the row address RADD, if the operation control signal RD_CNT is enabled. The code storage circuit 2 may include a bit line sense amplifier (not shown), an input/output (I/O) line sense amplifier (not shown), a plurality of I/O lines (not shown) and a plurality of control switches (not shown) to perform a read operation for outputting the output code COUT<1:M> if the operation control signal RD_CNT is enabled.

The code storage circuit 2 may store an input code CIN<1:M> into one of the first to fourth code storage circuits 211, 212, 221, and 222 in response to a pre-charge command PCG. The code storage circuit 2 may store the input code CIN<1:M> into one of the first to fourth code storage circuits 211, 212, 221, and 222 according to logic levels of the bank address BADD and the row address RADD, if the pre-charge command PCG is enabled. The pre-charge command PCG may be generated by decoding an external command (not shown) and may be enabled to perform a pre-charge operation. A logic level of the pre-charge command PCG which is enabled may be set to be different according to the embodiment. The code storage circuit 2 may include a bit line sense amplifier (not shown), a write driver (not shown), a plurality of I/O lines (not shown), and a plurality of control switches (not shown) to perform a write operation for receiving the input code CIN<1:M> if the pre-charge command PCG which is enabled.

The latch circuit 3 may include a first latch circuit 31 and a second latch circuit 32. The latch circuit 3 may store the output code COUT<1:M> into the first latch circuit 31 or the second latch circuit 32 in response to the active command ACT and the bank address BADD. The latch circuit 3 may store the output code COUT<1:M> into one of the first latch circuit 31 and the second latch circuit 32 according to a logic level of the bank address BADD if the active command ACT is enabled. The latch circuit 3 may store the output code COUT<1:M> outputted from the first bank code storage circuit 21 into the first latch circuit 31 if the active command ACT is enabled while the bank address BADD has a logic "low" level. In particular, the first latch circuit 31 may latch the output code COUT<1:M> if the data lifetime code corresponding to data stored in the first bank code storage circuit 21 is outputted as the output code COUT<1:M>. Also, the second latch circuit 32 may latch the output code COUT<1:M> if the data lifetime code corresponding to data stored in the second bank code storage circuit 22 is outputted as the output code COUT<1:M>. The latch circuit 3 may store the output code COUT<1:M> outputted from the second bank code storage circuit 22 into the second latch circuit 32 if the active command ACT is enabled while the bank address BADD has a logic "high" level.

The latch circuit 3 may output the latched output code COUT<1:M> as a first latch code LC1<1:M> from the first latch circuit 31 or may output the latched output code COUT<1:M> as a second latch code LC2<1:M> from the second latch circuit 32, in response to at least one of a write command WT and the bank address BADD. The latch circuit 3 may output the first latch code LC1<1:M> from the first latch circuit 31 or the second latch code LC2<1:M> from the second latch circuit 32 according to a logic level of the bank address BADD, if the write command WT is enabled. The latch circuit 3 may output the first latch code LC1<1:M> from the first latch circuit 31 if the write command WT is enabled while the bank address BADD is set to have a logic "low" level. The latch circuit 3 may output the second latch code LC2<1:M> from the second latch circuit 32 if the write command WT is enabled while the bank address BADD is set to have a logic "high" level. The write command WT may be generated by decoding an external command (not shown) and may be enabled to perform the write operation. A logic level of the write command WT which is enabled may be set to be different according to the embodiment.

The latch circuit 3 may store a write code WCD<1:M> into the first latch circuit 31 or the second latch circuit 32 in response to a detection signal DET and the bank address BADD. The latch circuit 3 may store the write code WCD<1:M> into one of the first latch circuit 31 and the second latch circuit 32 according to a logic level of the bank address BADD, if the detection signal DET is enabled. The latch circuit 3 may store the write code WCD<1:M> into the first latch circuit 31 if the detection signal DET is enabled while the bank address BADD is set to have a logic "low" level. The latch circuit 3 may store the write code WCD<1: M> into the second latch circuit 32 if the detection signal DET is enabled while the bank address BADD is set to have a logic "high" level. A logic level of the detection signal DET which is enabled may be set to be different according to the embodiment.

The latch circuit 3 may output the input code CIN<1:M> from the first latch circuit 31 or the second latch circuit 32 in response to the pre-charge command PCG and the bank address BADD. In other words, the latch circuit 3 may output the latched output code COUT<1:M> as the input code CIN<1:M> during a pre-charge operation. The latch circuit 3 may output the input code CIN<1:M> from the first latch circuit 31 or the second latch circuit 32 according to a logic level of the bank address BADD, if the pre-charge command PCG is enabled. The latch circuit 3 may output the input code CIN<1:M> from the first latch circuit 31 if the pre-charge command PCG is enabled while the bank address BADD is set to have a logic "low" level. The latch circuit 3 may output the input code CIN<1:M> from the second latch circuit 32 if the pre-charge command PCG is enabled while the bank address BADD is set to have a logic "high" level.

The code comparison circuit 4 may compare the first or second latch code LC1<1:M> or LC2<1:M> with the write code WCD<1:M> to generate the detection signal DET, in response to a delayed write command WTd and the bank address BADD. The delayed write command WTd may be generated by delaying the write command WT by a predetermined period. The code comparison circuit 4 may compare the first or second latch code LC1<1:M> or LC2<1:M> with the write code WCD<1:M> to generate the detection signal DET according to a logic level of the bank address BADD, if the delayed write command WTd is enabled. The code comparison circuit 4 may compare the first latch code LC1<1:M> with the write code WCD<1:M> to generate the detection signal DET if the delayed write command WTd is enabled while the bank address BADD is set to have a logic "low" level. The code comparison circuit 4 may generate the detection signal DET which is enabled if the write code WCD<1:M> is set to have a value greater than a value of the first latch code LC1<1:M>. The code comparison circuit 4 may compare the second latch code LC2<1:M> with the write code WCD<1:M> to generate the detection signal DET if the delayed write command WTd is enabled while the bank address BADD is set to have a logic "high" level. The code comparison circuit 4 may generate the detection signal DET which is enabled if the write code WCD<1:M> is set to have a value greater than a value of the second latch code LC2 <1:M>.

Figure 2:
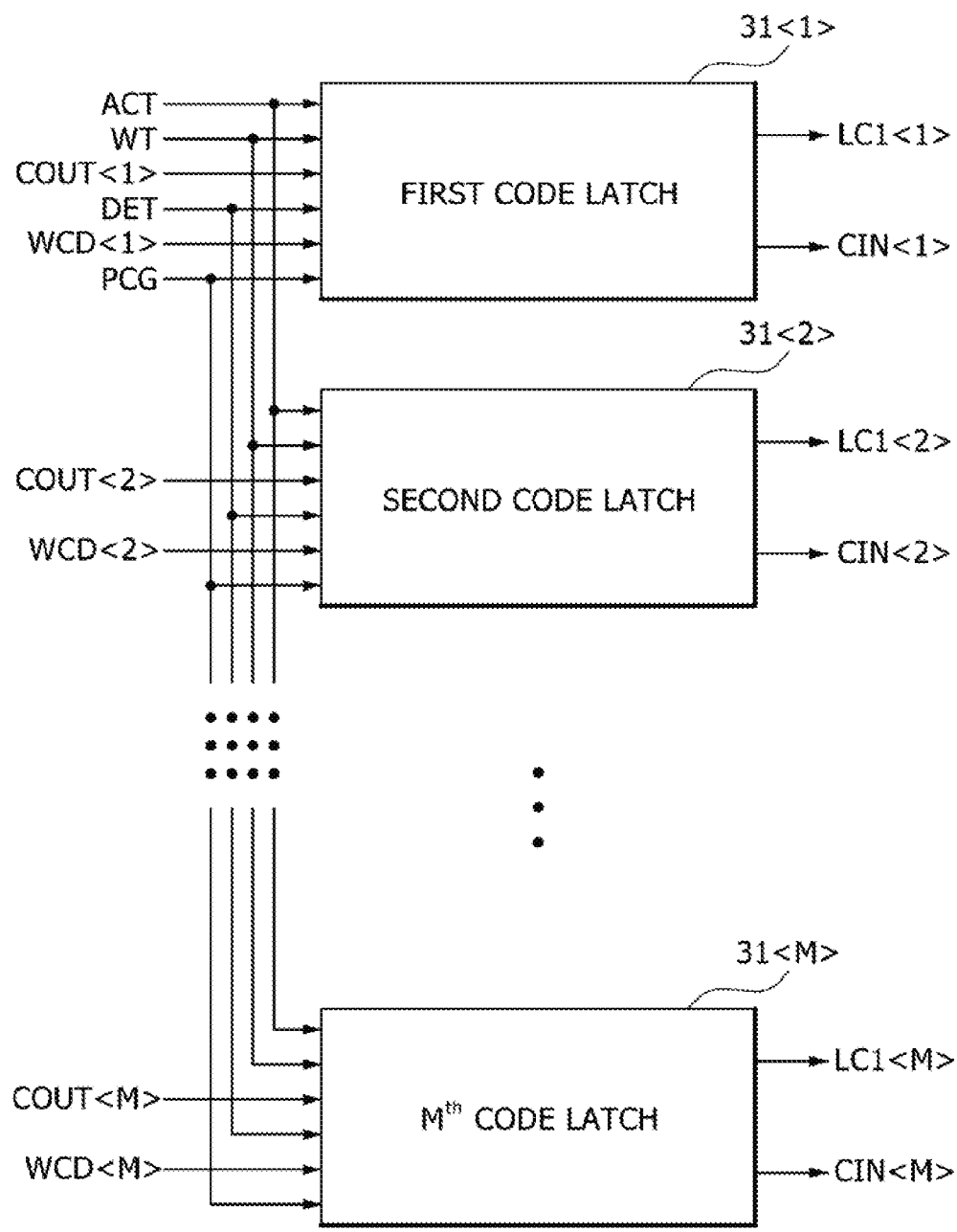
FIG. 2 is a block diagram illustrating a configuration of an example of a first latch circuit included in the semiconductor device of FIG. 1.

Referring to FIG. 2, the first latch circuit 31 may include first to $M^{th}$ code latches 31<1:M>.

The first code latch 31<1> may store the output code COUT<1> therein if the active command ACT is enabled. The first code latch 31<1> may output the first latch code LC1<1> if the write command WT is enabled. The first code latch 31<1> may store the write code WCD<1> therein if the detection signal DET is enabled. The first code latch 31<1> may output the input code CIN<1> if the pre-charge command PCG is enabled. A configuration and an operation of the first code latch 31<1> will be described more fully later with reference to FIG. 3.

The second code latch 31<2> may store the output code COUT<2> therein if the active command ACT is enabled. The second code latch 31<2> may output the first latch code LC1<2> if the write command WT is enabled. The second code latch 31<2> may store the write code WCD<2> therein if the detection signal DET is enabled. The second code latch 31<2> may output the input code CIN<2> if the pre-charge command PCG is enabled.

The $M^{th}$ code latch 31<M> may store the output code COUT<M> therein if the active command ACT is enabled. The $M^{th}$ code latch 31<M> may output the first latch code LC1<M> if the write command WT is enabled. The $M^{th}$ code latch 31<M> may store the write code WCD<M> therein if the detection signal DET is enabled. The $M^{th}$ code latch 31<M> may output the input code CIN<M> if the pre-charge command PCG is enabled.

The second latch circuit 32 may have substantially the same configuration as the first latch circuit 31 except for the input/output signals. Thus, a detailed description of a configuration and an operation of the second latch circuit 32 will be omitted hereinafter.

Figure 3:
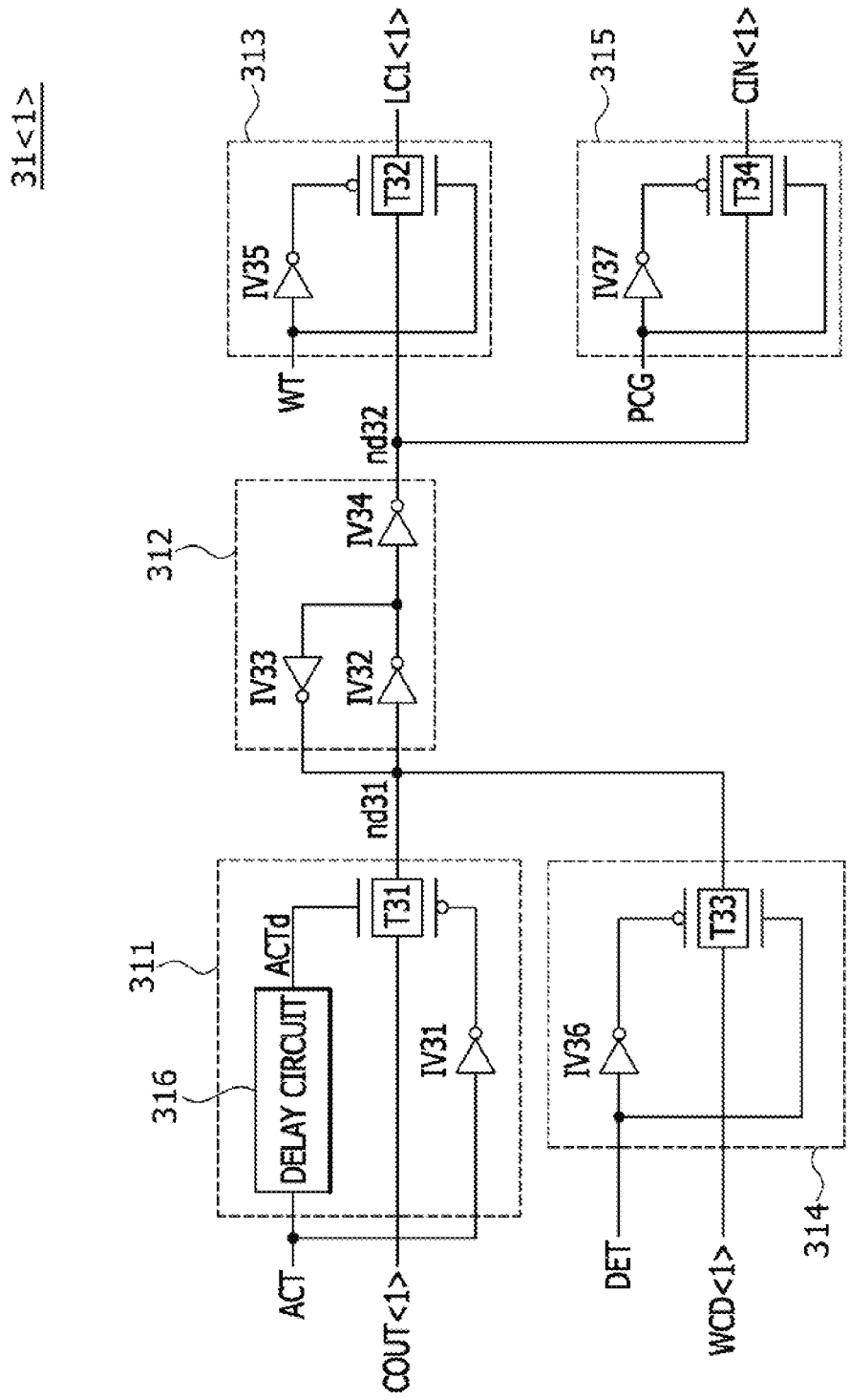
FIG. 3 is a circuit diagram illustrating an example of a first code latch included in the first latch circuit of FIG. 2.

Referring to FIG. 3, the first code latch 31<1> may include a first code input circuit 311, a latch 312, a first code output circuit 313, a second code input circuit 314, and a second code output circuit 315.

The first code input circuit 311 may include a delay circuit 316, an inverter IV31, and a transfer gate T31. The delay circuit 316 may delay the active command ACT by a predetermined period to generate a delayed active command ACTd. The inverter IV31 may inversely buffer the active command ACT and may output the inversely buffered active command. The transfer gate T31 may be turned on in synchronization with a time that the delayed active command ACTd is enabled to have a logic "high" level, thereby outputting the output code COUT<1>to a node nd31. That is, the first code input circuit 311 may output the output code COUT<1> to the node nd31 if the active command ACT is enabled.

The latch 312 may include inverters IV32, IV33, and IV34 which are coupled between the node nd31 and a node nd32. The latch 312 may receive the output code COUT<1> from the first code input circuit 311 to store the output code COUT<1>, if the active command ACT is enabled. The latch 312 may output the output code COUT<1> to the node nd32 if the active command ACT is enabled. The latch 312 may receive the write code WCD<1> from the second code input circuit 314 to store the write code WCD<1>, if the detection signal DET is enabled. The latch 312 may then output the write code WCD<1> to the node nd32 when the detection signal DET is enabled.

The first code output circuit 313 may include an inverter IV35 and a transfer gate T32. The inverter IV35 may inversely buffer the write command WT and may output the inversely buffered write command. The transfer gate T32 may be turned on in synchronization with a time that the write command WT is enabled to have a logic "high" level, thereby outputting a signal of the node nd32 as the first latch code LC1<1>. That is, the first code output circuit 313 may output a signal of the node nd32 as the first latch code LC1<1> if the write command WT is enabled.

The second code input circuit 314 may include an inverter IV36 and a transfer gate T33. The inverter IV36 may inversely buffer the detection signal DET and may output the inversely buffered detection signal. The transfer gate T33 may be turned on in synchronization with a time that the detection signal DET is enabled to have a logic "high" level, thereby outputting the write code WCD<1> to the node nd31. That is, the second code input circuit 314 may output the write code WCD<1> to the node nd31 if the detection signal DET is enabled.

The second code output circuit 315 may include an inverter IV37 and a transfer gate T34. The inverter IV37 may inversely buffer the pre-charge command PCG and may output the inversely buffered pre-charge command. The transfer gate T34 may be turned on in synchronization with a time that the pre-charge command PCG is enabled to have a logic "high" level, thereby outputting a signal of the node nd32 as the input code CIN<1>. That is, the second code output circuit 315 may output a signal of the node nd32 as the input code CIN<1> if the pre-charge command PCG is enabled.

Figure 4:
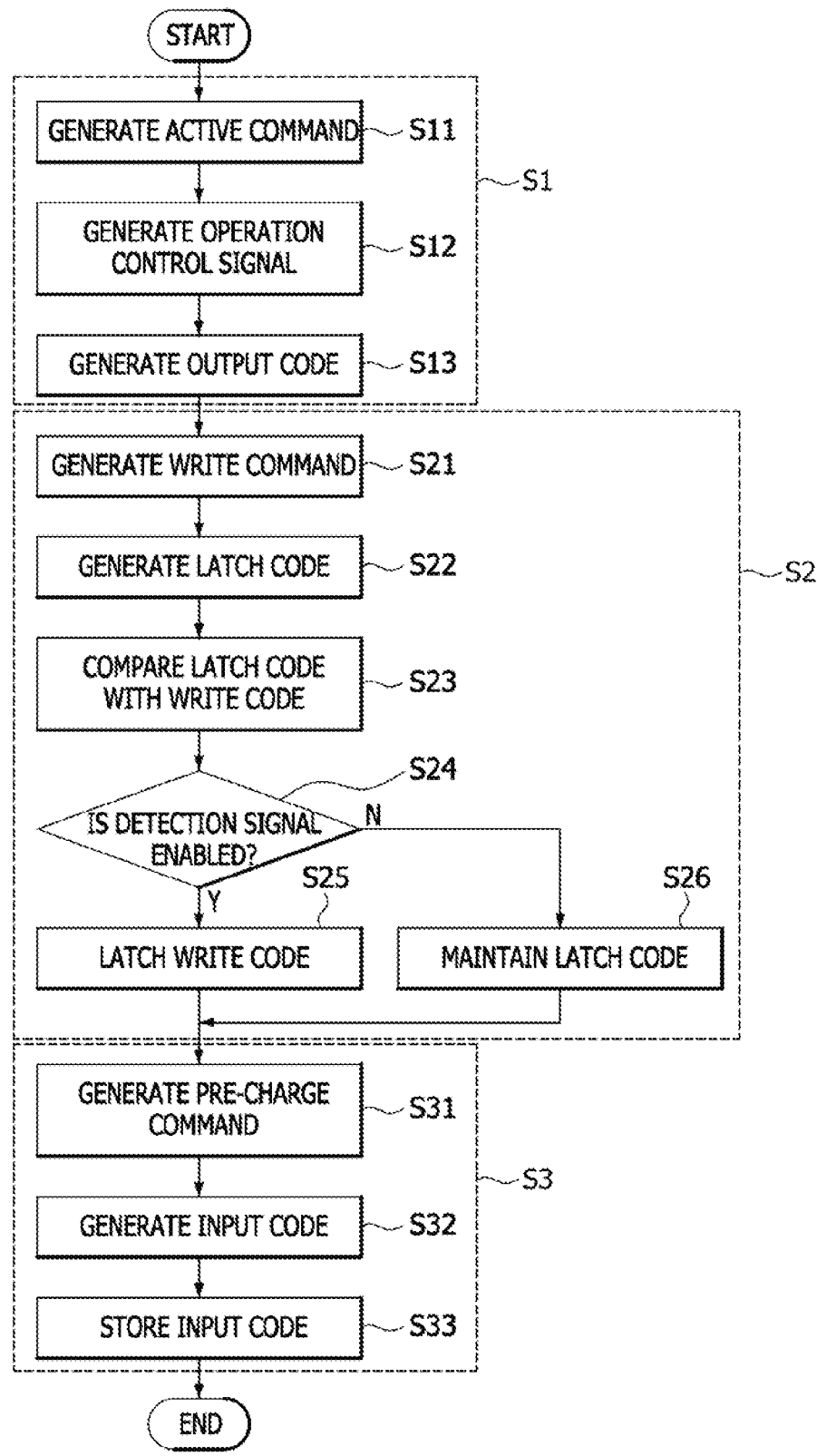
FIG. 4 is a flowchart illustrating an operation of the semiconductor device of FIG. 1.

An operation of the semiconductor device having the aforementioned configuration will be described hereinafter with reference to FIG. 4. The operation of the semiconductor device will be described in conjunction with an active operation (see a step S1 of FIG. 4), a write operation (see a step S2 of FIG. 4), and a pre-charge operation (see a step S3 of FIG. 4).

First, the active operation S1 will be described hereinafter.

If the active command ACT generated by decoding an external command (not shown) is enabled, the active operation S1 may commence (step S11). If the active command ACT is enabled, the operation control signal RD_CNT which is enabled may be generated (step S12). If the operation control signal RD_CNT is enabled, one of the first to fourth data lifetime codes LC1, LC2, LC3, and LC4 may be selected as the output code COUT<1:M> according to logic levels of the bank address BADD and the row address RADD (step S13).

Next, the write operation S2 will be described hereinafter.

The latched output code output code COUT<1:M> may be transformed into the latch code LC1<1:M> or LC2<1:M> based on the write command WT. If the write command WT generated by decoding an external command (not shown) is enabled, the write operation S2 may commence (step S21). If the write command WT is enabled, the first latch code LC1<1:M> may be generated by the first latch circuit 31 or the second latch code LC2<1:M> may be generated by the second latch circuit 32 according to a logic level of the bank address BADD (step S22). The first latch code LC1<1:M> or the second latch code LC2<1:M> may be compared with the write code WCD<1:M> to generate the detection signal DET (step S23). Enablement of the detection signal DET may be determined (step S24). If the detection signal DET is enabled, the write code WCD<1:M> may be latched by the first latch circuit 31 or the second latch circuit 32 (step S25). If the detection signal DET is disabled, the first latch code LC1<1:M> stored in the first latch circuit 31 and the second latch code LC2<1:M> stored in the second latch circuit 32 may be maintained (step S26).

Finally, the pre-charge operation S3 will be described hereinafter.

If the pre-charge command PCG generated by decoding an external command (not shown) is enabled, the pre-charge operation S3 may commence (step S31). If the pre-charge command PCG is enabled, the input code CIN<1:M> may be generated by the first latch circuit 31 or the second latch circuit 32 (step S32). The input code CIN<1:M> outputted from the first latch circuit 31 or the second latch circuit 32 may be stored into the code storage circuit 2 (step S33).

Referring to a table illustrated in FIG. 5, various data DATA and various data lifetime codes selected according to logic levels of the bank address BADD and the row address RADD are listed. If the bank address BADD has a logic "low" level and the row address RADD has a logic "low" level, first data D1 and a data lifetime code having a logic level combination of '010' may be selected by a first row path R1 included in a first bank B1. The first bank B1 may be a bank which is selected if the bank address BADD has a logic "low" level, and the first row path R1 may be a path which is selected if the row address RADD has a logic "low" level. If the bank address BADD has a logic "low" level and the row address RADD has a logic "high" level, second data D2 and a data lifetime code having a logic level combination of '011' may be selected by a second row path R2 included in the first bank B1. The second row path R2 may be a path which is selected if the row address RADD has a logic "high" level. If the bank address BADD has a logic "high" level and the row address RADD has a logic "low" level, third data D3 and a data lifetime code having a logic level combination of '011' may be selected by a first row path R1 included in a second bank B2. The second bank B2 may be a bank which is selected if the bank address BADD has a logic "high" level. If the bank address BADD has a logic "high" level and the row address RADD has a logic "high" level, fourth data D4 and a data lifetime code having a logic level combination of '010' may be selected by a second row path R2 included in the second bank B2.

The write operation performed when the data DATA and the data lifetime codes illustrated in FIG. 5 are stored will be described hereinafter. For example, if a data lifetime code having a logic level combination of '110' is inputted as the data lifetime code (having a logic level combination of '011') of the third data D3 selected by the first row path R1 included in the second bank B2, the data lifetime code of the third data D3 may be updated to have a logic level combination of '110' because the logic level combination of '110' is greater than the logic level combination of '011'. That is, the stored data lifetime code may be updated to have a logic level combination of a new data lifetime code which is inputted as the stored data lifetime code only if the new data lifetime code is greater than the stored data lifetime code. As a result, power consumption of the semiconductor device may be reduced, and the data lifetime code may be efficiently stored.

Figure 6:
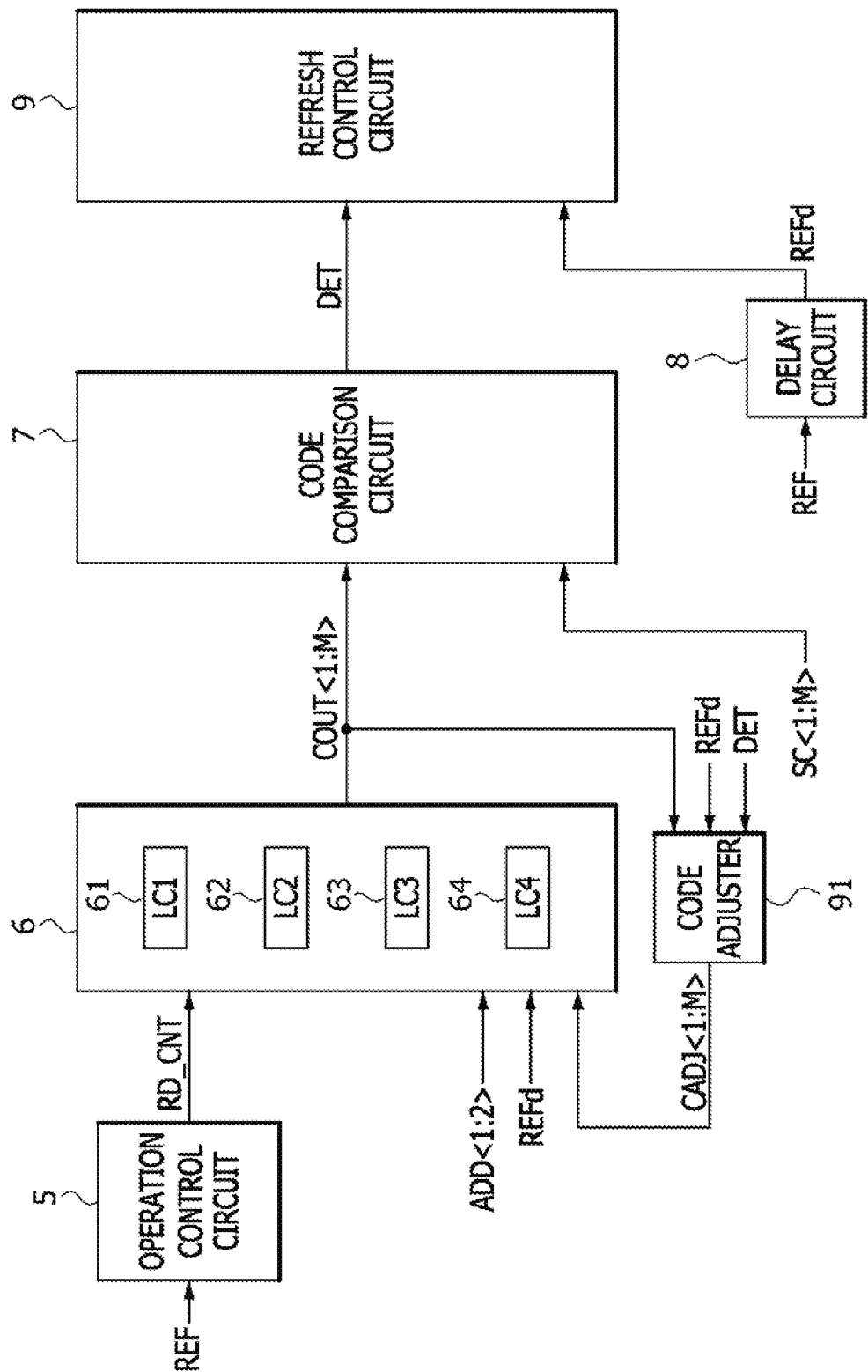
FIG. 6 is a block diagram illustrating a configuration of a semiconductor device according to another embodiment of the present disclosure.

As illustrated in FIG. 6, a semiconductor device according to another embodiment may include an operation control circuit 5, a code storage circuit 6, a code comparison circuit 7, a delay circuit 8, a refresh control circuit 9, and a code adjuster 91.

The operation control circuit 5 may generate an operation control signal RD_CNT in response to a refresh command REF. The operation control circuit 5 may generate the operation control signal RD_CNT which is enabled if the refresh command REF is enabled. The refresh command REF may be generated by decoding an external command (not shown) and may be enabled to perform a refresh operation. The refresh command REF may be enabled in any one of various manners according to the embodiments. For example, the refresh command REF may be enabled by generating a pulse for performing the refresh operation. The operation control signal RD_CNT may be enabled to control an internal read operation that outputs a data lifetime code which is stored in the code storage circuit 6. Logic levels of the refresh command REF and the operation control signal RD_CNT which are enabled may be set to be different according to the embodiment.

The code storage circuit 6 may include a first code storage circuit 61, a second code storage circuit 62, a third code storage circuit 63, and a fourth code storage circuit 64. One of the first to fourth code storage circuits 61, 62, 63, and 64 may be selected by an address ADD<1:2>. For example, the first code storage circuit 61 may be selected if the address ADD<1:2> has a logic level combination of 'L, L', and the second code storage circuit 62 may be selected if the address ADD<1:2> has a logic level combination of 'L, H'. In addition, the third code storage circuit 63 may be selected if the address ADD<1:2> has a logic level combination of 'H, L', and the fourth code storage circuit 64 may be selected if the address ADD<1:2> has a logic level combination of 'H, H'. The first code storage circuit 61 may store a first data lifetime code LC1 corresponding to first data (D1 of FIG. 11). The second code storage circuit 62 may store a second data lifetime code LC2 corresponding to second data (D2 of FIG. 11). The third code storage circuit 63 may store a third data lifetime code LC3 corresponding to third data (D3 of FIG. 11). The fourth code storage circuit 64 may store a fourth data lifetime code LC4 corresponding to fourth data (D4 of FIG. 11). The first, second, third, and fourth code storage circuits 61, 62, 63, and 64 may be realized using dynamic random access memory (DRAM) devices or static random access memory (SRAM) devices.

The code storage circuit 6 may output one of the first to fourth data lifetime codes LC1, LC2, LC3, and LC4 stored in the first to fourth code storage circuits 61, 62, 63, and 64 as an output code COUT<1:M>, in response to the operation control signal RD_CNT. The code storage circuit 6 may output one of the first to fourth data lifetime codes LC1, LC2, LC3, and LC4 as the output code COUT<1:M> according to a logic level combination of the address ADD<1:2>, if the operation control signal RD_CNT is enabled. The code storage circuit 6 may include a bit line sense amplifier (not shown), an input/output (I/O) line sense amplifier (not shown), a plurality of I/O lines (not shown), and a plurality of control switches (not shown) to perform a read operation for outputting the output code COUT<1:M> if the operation control signal RD_CNT is enabled.

The code storage circuit 6 may receive an adjustment code CADJ<1:M> and may store the adjustment code CADJ<1:M> into one of the first to fourth code storage circuits 61, 62, 63, and 64, in response to a delayed refresh command REFd. The code storage circuit 6 may generate the output code COUT<1:M> based on the delayed refresh command REFd. The code storage circuit 6 may replace one of the first to fourth data lifetime codes LC1, LC2, LC3, and LC4 with the adjustment code CADJ<1:M> according to a logic level combination of the address ADD<1:2> if the delayed refresh command REFd is enabled. Because the adjustment code CADJ<1:M> is stored into the code storage circuit 6 after a predetermined period elapses from a time that the refresh operation is performed, the code storage circuit 6 may use another signal, which is enabled after a predetermined period elapses from a time that the refresh operation is performed, instead of the delayed refresh command REFd.

The code comparison circuit 7 may compare the output code COUT<1:M> with a set code SC<1:M> to generate a detection signal DET. A logic level combination of the set code SC<1:M> may be set to be different according to the embodiment. For example, all of the bits included in the set code SC<1:M> may be set to have a logic "low" level. The code comparison circuit 7 may generate the detection signal DET which is enabled if the output code COUT<1:M> has the same logic level combination as the set code SC<1:M>. A logic level of the detection signal DET which is enabled may be set to be different according to the embodiment.

The delay circuit 8 may delay the refresh command REF by a predetermined period (corresponding to a delay time of the delay circuit 8) to generate the delayed refresh command REFd. The delayed refresh command REFd may be enabled after a predetermined period elapses from a time that the refresh command REF is enabled. The delay time of the delay circuit 8 may be set to be different according to the embodiment.

The refresh control circuit 9 may control the refresh operation in response to the detection signal DET and the delayed refresh command REFd. The refresh control circuit 9 may perform the refresh operation if the delayed refresh command REFd is enabled while the detection signal DET is disabled. If the detection signal DET is enabled, the refresh operation may terminate because the data lifetime code outputted from the code storage circuit 6 is identical to the set code SC<1:M>. Accordingly, the power consumption of the semiconductor device may be reduced. Because the refresh operation is controlled after a predetermined period elapses from a time that the refresh operation is performed, the refresh control circuit 9 may use another signal, which is enabled after a predetermined period elapses from a time that the refresh operation is performed, instead of the delayed refresh command REFd.

The code adjuster 91 may generate the adjustment code CADJ<1:M> from the output code COUT<1:M> in response to the detection signal DET and the delayed refresh command REFd. The code adjuster 91 may adjust the output code COUT<1:M> to generate the adjustment code CADJ<1:M> if at least one of the detection signal DET and the delayed refresh command REFd are enabled. For example, the code adjuster 91 may count down the output code COUT<1:M> having a logic level combination of '100' by one bit to generate the adjustment code CADJ<1:M> which is set to have a logic level combination of '011'. A manner for adjusting the output code COUT<1:M> may be different according to the embodiment. Because the output code COUT<1:M> is adjusted after a predetermined period elapses from a time that the refresh operation is performed, the refresh control circuit 9 may use another signal, the code adjuster 91 may use another signal, which is enabled after a predetermined period elapses from a time that the refresh operation is performed, instead of the delayed refresh command REFd.

Although the semiconductor device illustrated in FIG. 6 performs the refresh operation in response to the refresh command REF, the present disclosure is not limited thereto. For example, even in semiconductor devices performing various control operations including a recharge operation, execution of the various control operations may be controlled according the data lifetime code.

Figure 7:
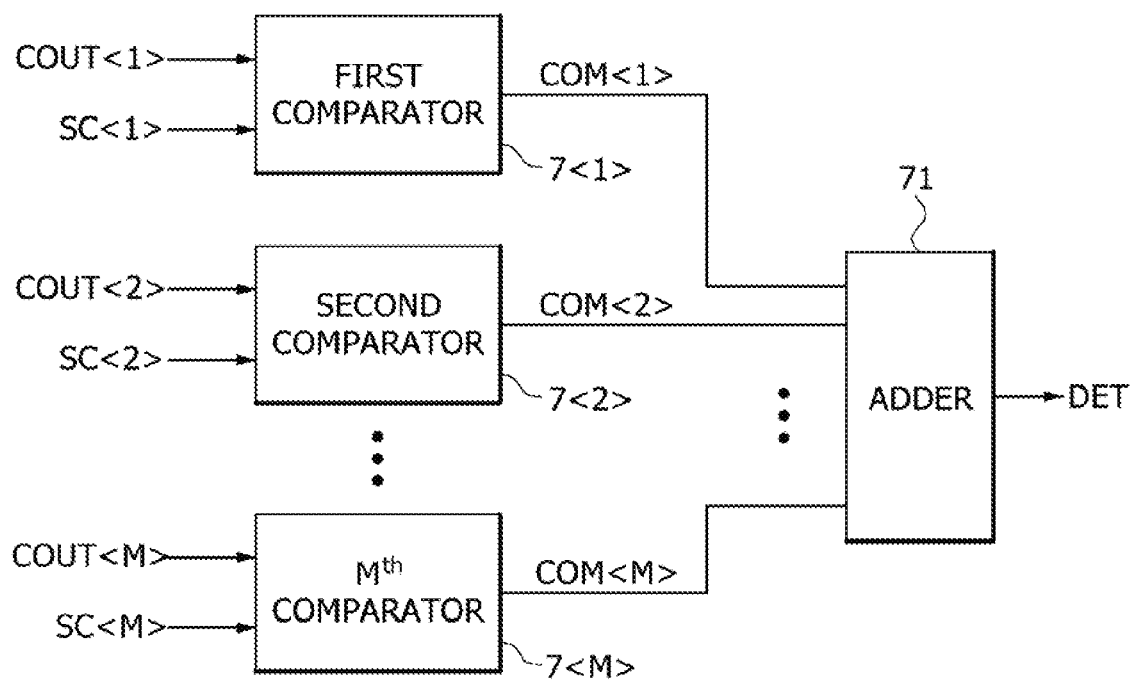
FIG. 7 is a block diagram illustrating a configuration of an example of a code comparison circuit included in the semiconductor device of FIG. 6.

Referring to FIG. 7, the code comparison circuit 7 may include first to $M^{th}$ comparators 7<1:M> and an adder 71. The first to $M^{th}$ comparators 7<1:M> may compare the output code COUT<1:M> with the set code SC<1:M> to generate first to $M^{th}$ comparison signals COM<1:M>. The adder 71 may add up the first to $M^{th}$ comparison signals COM<1:M> to generate the detection signal DET. The first to $M^{th}$ comparators 7<1:M> may generate the first to $M^{th}$ comparison signals COM<1:M> having a predetermined logic level if the output code COUT<1:M> is identical to the set code SC<1:M>. The adder 71 may generate the detection signal DET which is enabled if all of the first to $M^{th}$ comparison signals COM<1:M> have the predetermined logic level. Thus, the code comparison circuit 7 may generate an enabled the detection signal DET if the output code COUT<1:M> is identical to the set code SC<1:M>.

Figure 8:
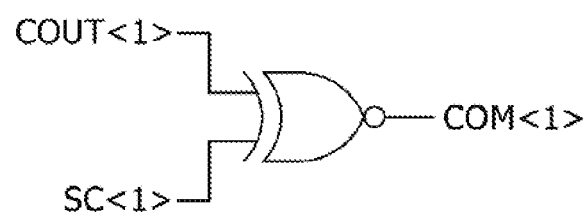
FIG. 8 is a circuit diagram illustrating an example of a first comparator included in the code comparison circuit of FIG. 7.

Referring to FIG. 8, the first comparator 7<1> may receive the output code COUT<1> and the set code SC<1> and may perform an exclusive NOR operation of the output code COUT<1> and the set code SC<1> to generate the first comparison signal COM<1>. The first comparator 7<1> may generate the first comparison signal COM<1> having a logic "high" level if the output code COUT<1> is identical to the set code SC<1>.

Figure 9:
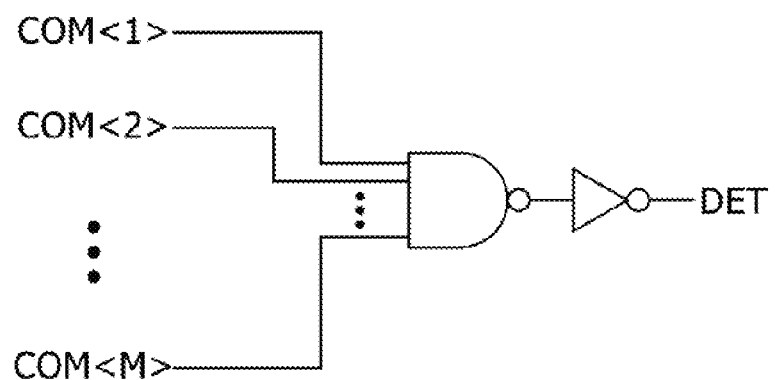
FIG. 9 is a circuit diagram illustrating an example of an adder included in the code comparison circuit of FIG. 7.

Referring to FIG. 9, the adder 71 may receive the first to $M^{th}$ comparison signals COM<1:M> and may perform an AND operation of the first to $M^{th}$ comparison signals COM<1:M> to generate the detection signal DET. The adder 71 may generate the detection signal DET which is enabled to have a logic "high" level if all of the first to $M^{th}$ comparison signals COM<1:M> have a logic "high" level.

Figure 10:
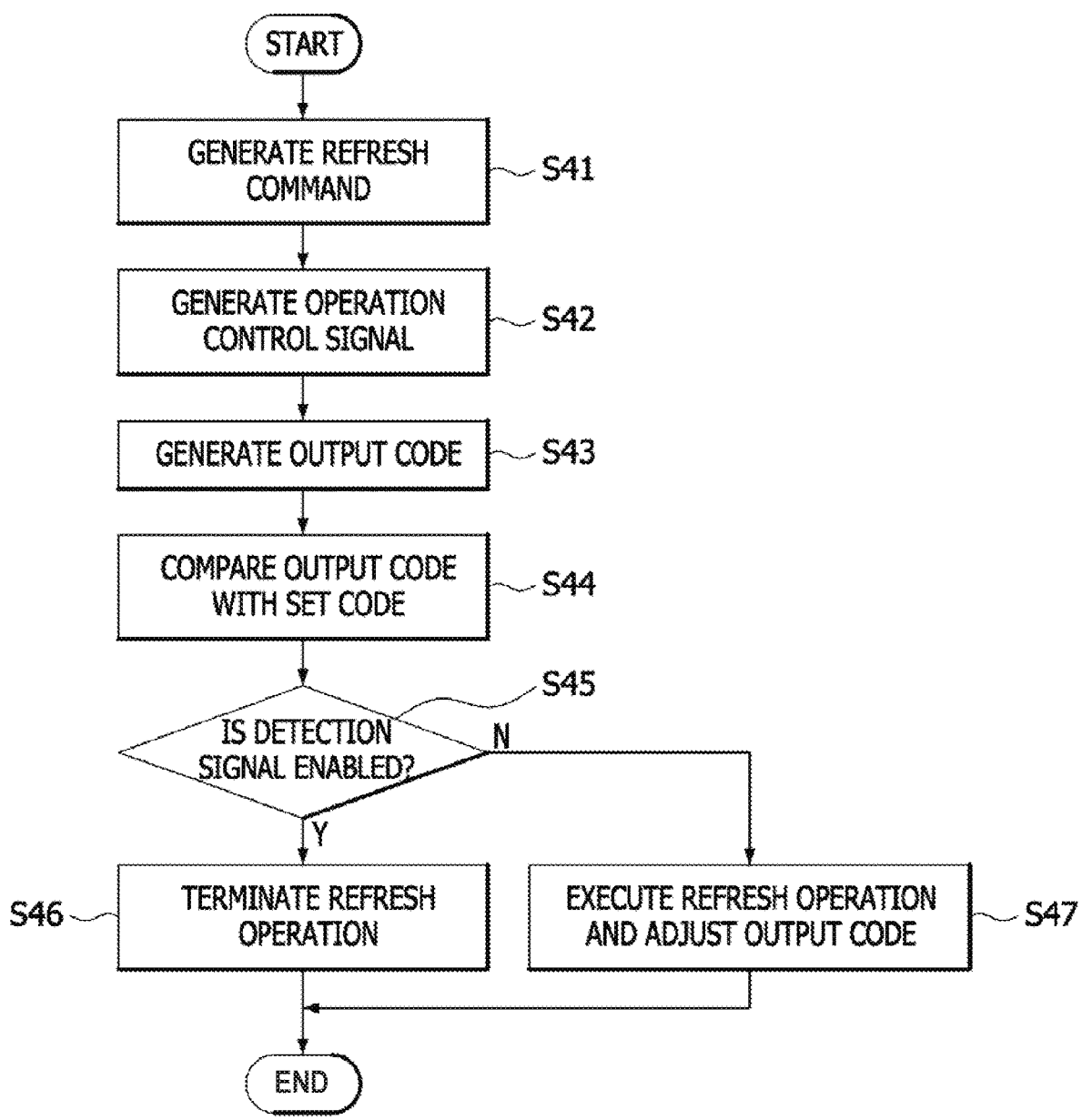
FIG. 10 is a flowchart illustrating a refresh operation performed in the semiconductor device of FIG. 6.

The refresh operation of the semiconductor device having the aforementioned configuration will be described hereinafter with reference to FIG. 10.

If the refresh command REF generated by decoding an external command (not shown) is enabled, the refresh operation may commence (step S41). If the refresh command REF is enabled, the operation control signal RD_CNT which is enabled may be generated (step S42). If the operation control signal RD_CNT is enabled, one of the first to fourth data lifetime codes LC1, LC2, LC3, and LC4 may be selected as the output code COUT<1:M> according to a logic level combination of the address ADD<1:2> (step S43). The output code COUT<1:M> may be compared with the set code SC<1:M> to generate the detection signal DET (step S44). Enablement of the detection signal DET may be determined (step S45). If the detection signal DET is enabled, the refresh operation may terminate (step S46). If the detection signal DET is disabled and the refresh command REF is enabled, the refresh operation may be executed and the output code COUT<1:M> may be adjusted (step S47).

Referring to a table illustrated in FIG. 11, various data DATA and various data lifetime codes selected according to logic level combinations of the address ADD<1:2> are listed. If the address ADD<1:2> has a logic level combination of 'L, L', first data D1 and a data lifetime code having a logic level combination of '010' may be selected by a first row path R1. If the address ADD<1:2> has a logic level combination of 'L, H', second data D2 and a data lifetime code having a logic level combination of '000' may be selected by a second row path R2. If the address ADD<1:2> has a logic level combination of 'H, L', third data D3 and a data lifetime code having a logic level combination of '011' may be selected by a third row path R3. If the address ADD<1:2>has a logic level combination of 'H, H', fourth data D4 and a data lifetime code having a logic level combination of '100' may be selected by a fourth row path R4.

The refresh operation performed when the data DATA and the data lifetime codes illustrated in FIG. 1 are stored will be described hereinafter.

If the refresh operation of the second data D2 selected by the second row path R2 is performed, the detection signal DET may be enabled because the second data D2 corresponding to the data lifetime code having a logic level combination of '000' has no data lifetime. Accordingly, the set code SC<1:M> may be set to a logic level combination that has no data lifetime. Thus, the refresh operation of the second data D2 selected by the second row path R2 will not be performed.

If the refresh operation of the fourth data D4 selected by the fourth row path R4 is performed, the detection signal DET may be disabled because the lifetime of the fourth data D4 corresponding to the data lifetime code having a logic level combination of '100' remains. Thus, the refresh operation of the fourth data D4 selected by the fourth row path R4 may be performed, and the data lifetime code corresponding to the fourth data D4 may be counted down by one bit to have a logic level combination of '011'.

Figure 12:
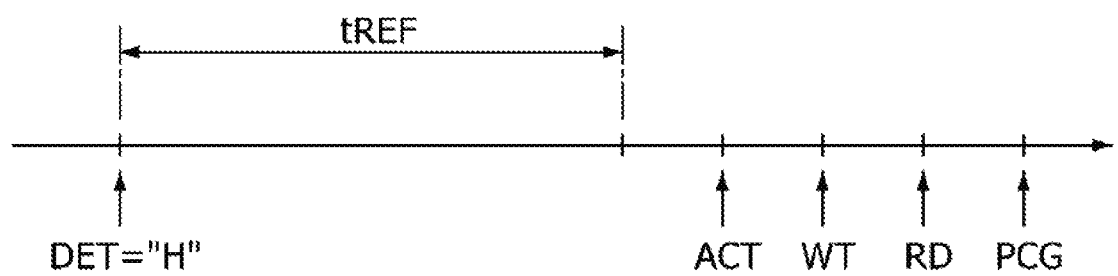
FIGS. 12 and 13 are timing diagrams illustrating refresh operations performed in the semiconductor devices of FIGS. 1 and 6.

Referring to FIG. 12, if data lifetime remains and the detection signal DET is enabled to have a logic "high(H)" level, the refresh operation may be performed during a refresh period tREF. In such a case, an active operation ACT, a write operation WT, a read operation RD, and a pre-charge operation PCG may be performed after the refresh period tREF elapses from a time that the detection signal DET is enabled.

Figure 13:
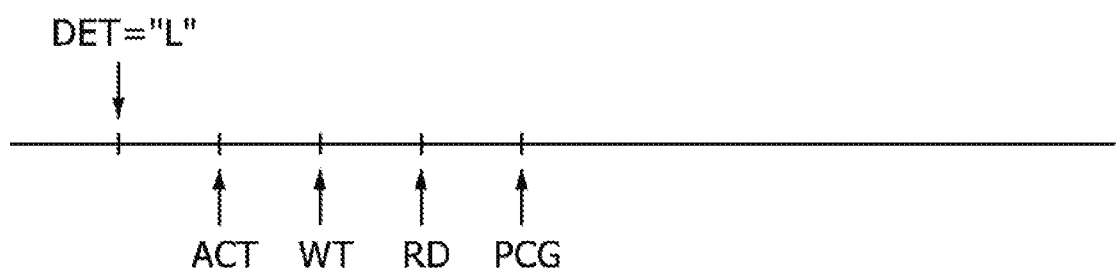

Referring to FIG. 13, if no data lifetime remains and the detection signal DET is disabled to have a logic "low(L)" level, the refresh operation will not be performed. Thus, the active operation ACT, the write operation WT, the read operation RD, and the pre-charge operation PCG may be performed before the refresh period tREF elapses from a time that the detection signal DET is disabled.

A semiconductor device according to the above embodiment may perform a refresh operation of data having a lifetime and may not perform the refresh operation of data having no lifetime. Thus, power consumption of the semiconductor device may be reduced.

Figure 14:
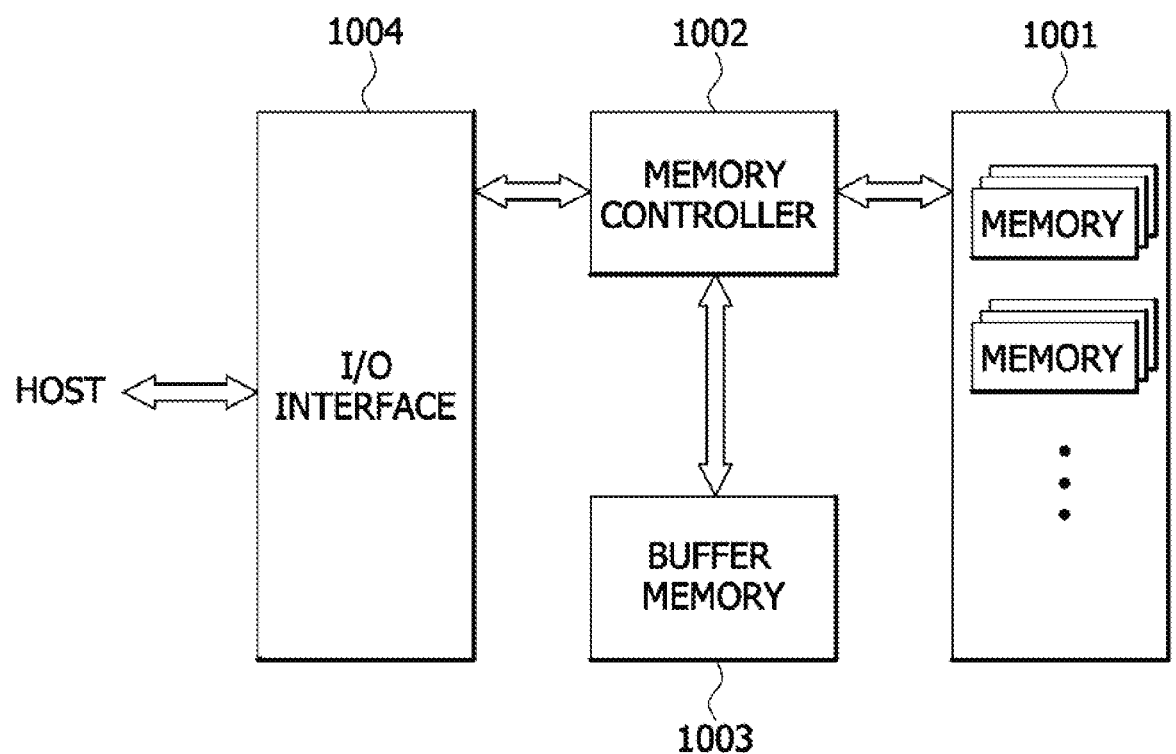
FIG. 14 is a block diagram illustrating a configuration of an electronic system employing at least one of the semiconductor devices illustrated in FIGS. 1 and 6.

At least one of the semiconductor devices described with reference to FIGS. 1 to 13 may be applied to an electronic system that includes a memory system, a graphic system, a computing system, a mobile system, or the like. For example, as illustrated in FIG. 14, an electronic system 1000 according an embodiment may include a data storage circuit 1001, a memory controller 1002, a buffer memory 1003, and an input/output (I/O) interface 1004.

The data storage circuit 1001 may store data which is outputted from the memory controller 1002 or may read and output the stored data to the memory controller 1002, according to a control signal generated by the memory controller 1002. The data storage circuit 1001 may include at least one of the semiconductor devices illustrated in FIGS. 1 and 6. Meanwhile, the data storage circuit 1001 may include a nonvolatile memory that can retain stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 14 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store data to be processed by the memory controller 1002. That is, the buffer memory 1003 may temporarily store data which is outputted from or inputted to the data storage circuit 1001. The buffer memory 1003 may store the data, which is outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated by the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI), and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
    a code comparison circuit configured to compare an output code generated based on a command with a set code to generate a detection signal controlling a predetermined operation; and
    a code adjuster configured to adjust the output code in response to the detection signal to generate an adjustment code, wherein the code adjuster counts down the output code to generate the adjustment code if the detection signal is enabled.

2. The semiconductor device of claim 1, wherein the set code is set to have a logic level combination that means data lifetime of zero.

3. The semiconductor device of claim 1, wherein the code comparison circuit generates the detection signal which is enabled if the output code is identical to the set code.

4. The semiconductor device of claim 1,
    wherein the predetermined operation terminates if the detection signal is enabled; and
    wherein the predetermined operation is a refresh operation or a recharge operation.

5. The semiconductor device of claim 1, wherein the adjustment code is stored as a data lifetime code corresponding to data selected by an address.

6. A method of handling a data lifetime code, the method comprising:
    comparing an output code generated based on a command with a set code to generate a detection signal controlling a predetermined operation; and
    adjusting the output code in response to the detection signal to generate an adjustment code, wherein the adjustment code is generated by counting down the output code if the detection signal is enabled.

7. The method of claim 6, wherein the set code is set to have a logic level combination that means data lifetime of zero.

8. The method of claim 6, wherein the detection signal is enabled if the output code is identical to the set code.

9. The method of claim 6,
    wherein the predetermined operation terminates if the detection signal is enabled; and
    wherein the predetermined operation is a refresh operation or a recharge operation.

10. The method of claim 6, wherein the adjustment code is stored as a data lifetime code corresponding to data selected by an address.

* * * * *